US010818444B2

(12) United States Patent
Henke et al.

(10) Patent No.: US 10,818,444 B2
(45) Date of Patent: Oct. 27, 2020

(54) HIGH POWER, MULTI-PHASE, AC POWER CONTACT ARC SUPPRESSOR

(71) Applicant: Arc Suppression Technologies, Bloomington, MN (US)

(72) Inventors: Reinhold Henke, Alexandria, MN (US); Warren Kahle, Woodbury, MN (US)

(73) Assignee: Arc Suppression Technologies, Bloomington, MN (US)

(*) Notice: Subject to any disclaimer, the term of this patent is extended or adjusted under 35 U.S.C. 154(b) by 0 days.

(21) Appl. No.: 16/776,339

(22) Filed: Jan. 29, 2020

(65) Prior Publication Data

US 2020/0243273 A1  Jul. 30, 2020

Related U.S. Application Data

(60) Provisional application No. 62/798,316, filed on Jan. 29, 2019, provisional application No. 62/798,323, (Continued)

(51) Int. Cl.
*H02H 9/00* (2006.01)
*H01H 9/30* (2006.01)
(Continued)

(52) U.S. Cl.
CPC .......... *H01H 9/30* (2013.01); *G01R 31/3272* (2013.01); *H01H 1/0015* (2013.01); *H01H 33/593* (2013.01); *H01H 50/44* (2013.01)

(58) Field of Classification Search
None
See application file for complete search history.

(56) References Cited

U.S. PATENT DOCUMENTS 3,716,770 A * 2/1973 Habisohn ................ H02P 25/20
                                                     318/259
5,420,571 A 5/1995 Coleman et al.
(Continued)

FOREIGN PATENT DOCUMENTS

WO   WO-2020160181 A1   8/2020

OTHER PUBLICATIONS

"International Application Serial No. PCT US2020 015725, International Search Report dated May 7, 2020", 5 pgs.
(Continued)

*Primary Examiner* — Stephen W Jackson
(74) *Attorney, Agent, or Firm* — Schwegman Lundberg & Woessner, P.A.

(57) ABSTRACT

An arc suppressing circuit configured to suppress arcing across a power contactor coupled to an alternating current (AC) power source having a predetermined number of phases, each contact of the power contactor corresponding to one of the predetermined number of phases includes a number of dual unidirectional arc suppressors equal to the predetermined number of phases of the AC power source. Each dual unidirectional arc suppressor includes a first phase-specific arc suppressor configured to suppress arcing across the associated contacts in a positive domain, a a second phase-specific arc suppressor configured to suppress arcing across the associated contacts in a negative domain, and a coil lock controller, configured to be coupled between a contact coil driver of the power contactor, configured to detect an output condition from the contact coil driver and inhibit operation of the first and second phase-specific arc suppressors over a predetermined time.

18 Claims, 9 Drawing Sheets

Related U.S. Application Data filed on Jan. 29, 2019, provisional application No. 62/798,326, filed on Jan. 29, 2019.

(51) Int. Cl.
*H01H 33/59* (2006.01)
*H01H 50/44* (2006.01)
*G01R 31/327* (2006.01)
*H01H 1/00* (2006.01)

(56) References Cited

U.S. PATENT DOCUMENTS

| | | |
|---|---|---|
| 7,705,601 B2 | 4/2010 | Zhou et al. |
| 2003/0184926 A1 | 10/2003 | Wu et al. |
| 2010/0134931 A1 | 6/2010 | Orozco |
| 2010/0153022 A1 | 6/2010 | Chen et al. |
| 2012/0123698 A1 | 5/2012 | Chen et al. |
| 2013/0187389 A1 | 7/2013 | Thangamani et al. |
| 2013/0235492 A1 | 9/2013 | Zhou et al. |
| 2016/0372285 A1* | 12/2016 | Guo .................. H01H 9/30 |
| 2017/0331283 A1 | 11/2017 | Potter et al. |

OTHER PUBLICATIONS

"International Application Serial No. PCT US2020 015725, Written Opinion dated May 7, 2020", 7 pgs.

\* cited by examiner

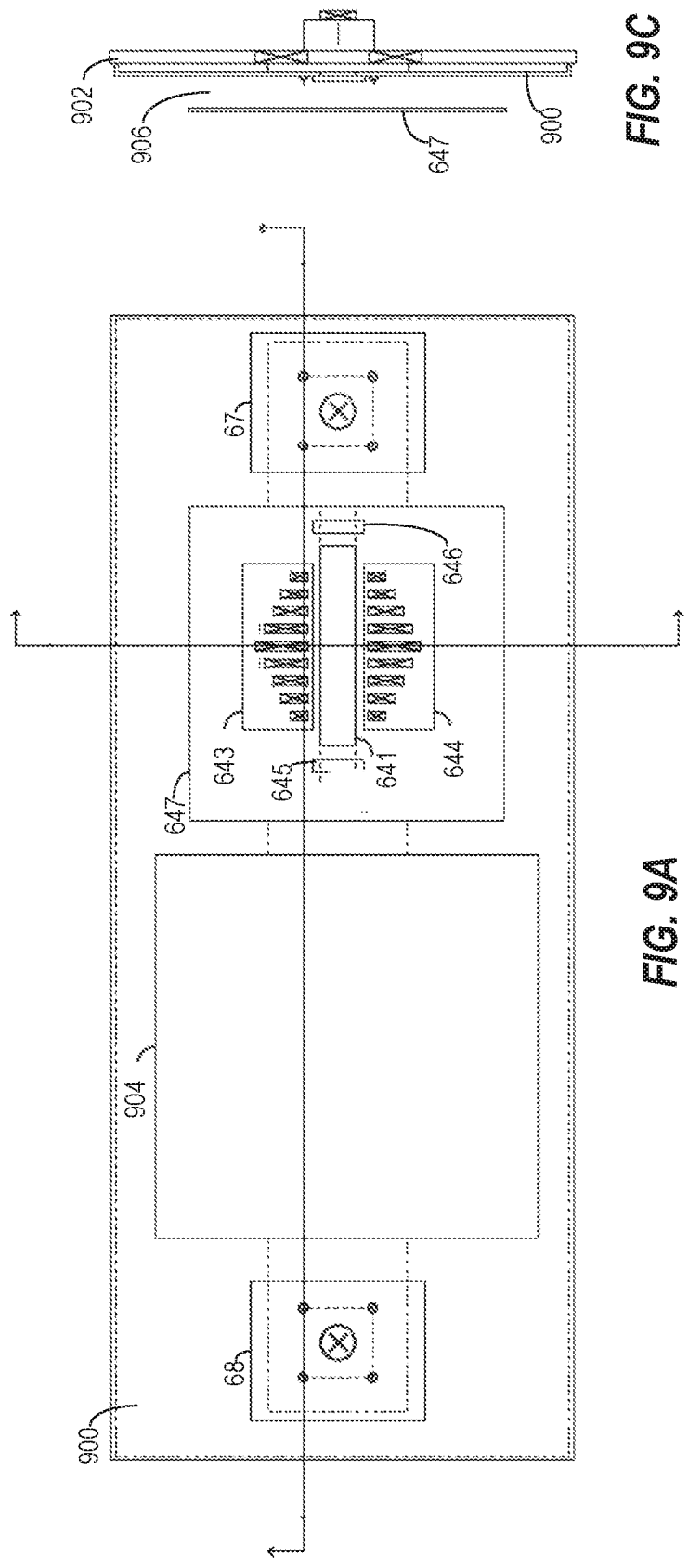
FIG. 9A
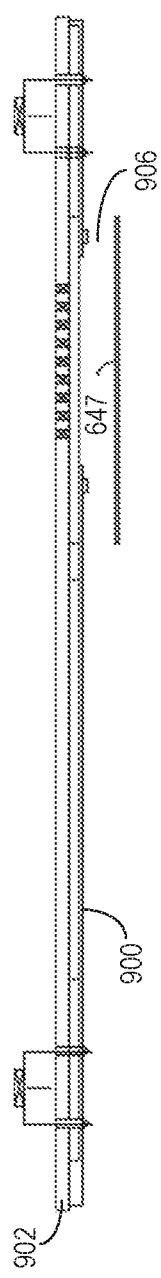
FIG. 9B
FIG. 9C

HIGH POWER, MULTI-PHASE, AC POWER CONTACT ARC SUPPRESSOR

PRIORITY

This application claims the benefit of priority to U.S. Provisional Application Ser. No. 62/798,316, filed Jan. 29, 2019; U.S. Provisional Application Ser. No. 62/798,323, filed Jan. 29, 2019; and U.S. Provisional Application Ser. No. 62/798,326, filed Jan. 29, 2019, the contents of all which are incorporated herein by reference in their entireties.

TECHNICAL FIELD

The present application relates generally to a high power multi-phase AC power contact arc suppressor.

BACKGROUND

Electrical current contact arcing may have deleterious effects on electrical contact surfaces, such as relays and certain switches. Arcing may degrade and ultimately destroy the contact surface over time and may result in premature component failure, lower quality performance, and relatively frequent preventative maintenance needs. Additionally, arcing in relays, switches, and the like may result in the generation of electromagnetic interference (EMI) emissions. Electrical current contact arcing may occur both in alternating current (AC) power and in direct current (DC) power across the fields of consumer, commercial industrial, automotive, and military applications. Because of its prevalence, there have literally been hundreds of specific means developed to address the issue of electrical current contact arcing.

BRIEF DESCRIPTION OF THE DRAWINGS

Some embodiments are illustrated by way of example and not limitation in the figures of the accompanying drawings.

FIGS. 9A-9C are perspective views of an implementation of a dual unidirectional arc suppressor, in an example embodiment.

DETAILED DESCRIPTION

Multi-phase power systems are a common method of AC power generation and transmission. The most common such multi-phase power is three-phase power, in which power is transmitted along three conductors, one hundred twenty degrees out of phase with respect to one another. As such, in a multi-phase power system, at any given time, the current on at least one conductor is in the positive domain while the current on at least one other conductor is in the negative domain. In balanced three-phase power systems, the sum of the instantaneous currents is zero, which may, on a system level inhibit attempts to suppress arcs at contacts in the three-phase system. Moreover, because of the constant cycling of each line of the three-phase system above and below the zero crossing, conventional arc suppressors may struggle with the resultant current densities.

Systems and methods have been developed to utilize arc suppressors to suppress arc formation at the earliest stages in multi-phase AC power arc generation and any related situation. By incorporating one dual unidirectional arc suppressor per phase of the multi-phase power system, the arc suppressing circuit as a whole is capable of suppressing arcs on all phases and in the positive and negative domains. The dual unidirectional arc suppressors each incorporate two separate arc suppressors, one to deal with arcing in the positive domain and one to deal with arcing in the negative domain. Each individual arc suppressor is automatically switched in and out by a trigger latching switch, such as a thermistor, that automatically cuts in and out as the alternating current transitions across the zero line.

Figure 1:
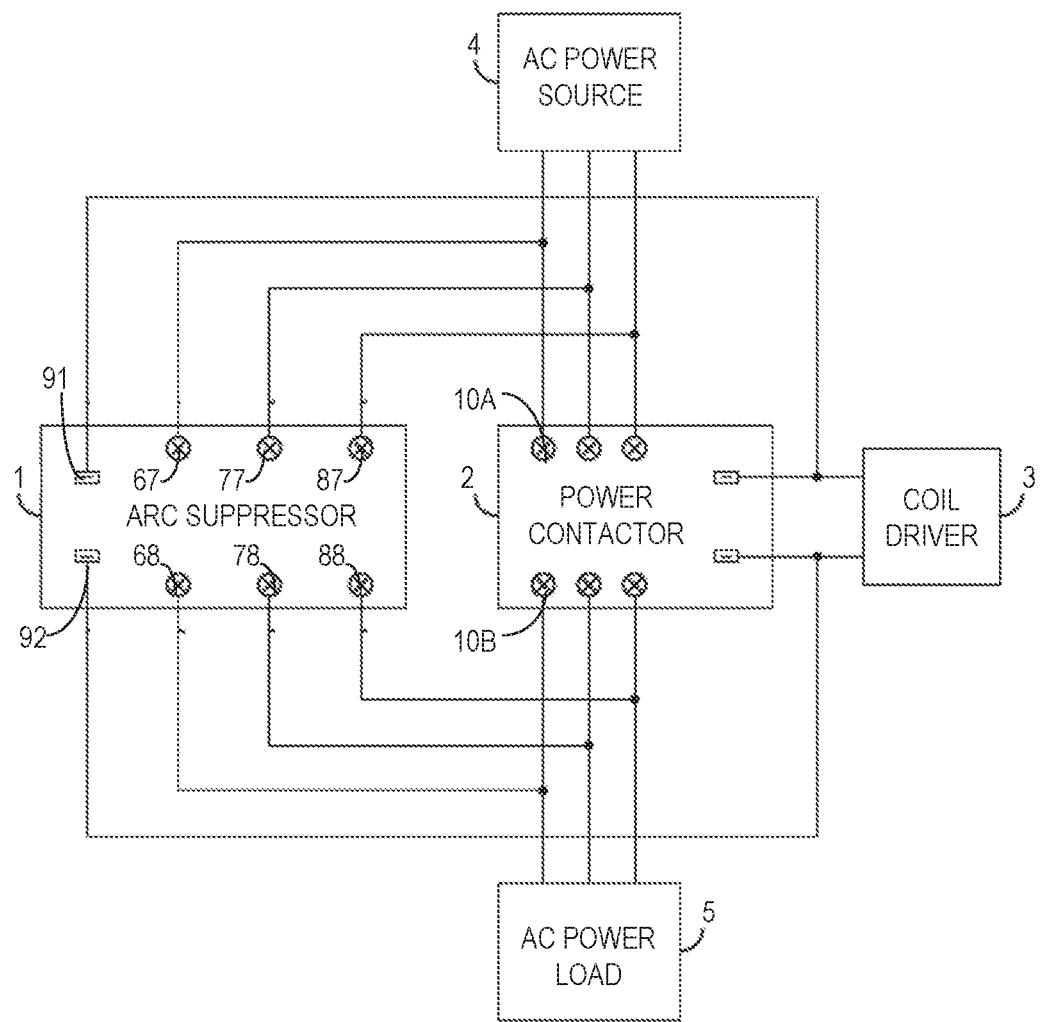
FIG. 1 is a block diagram of a high power, multi-phase AC power contact arc suppressor system, in an example embodiment.

FIG. 1 is a block diagram of a high power, multi-phase AC power contact arc suppressor system, in an example embodiment. The arc suppressing circuit 1 and a power contactor 2 may be any suitable AC power generation mode, e.g., single-phase, three-phase, or multi-phase generally. The power contactor 2 includes first contacts 10A and second contacts 10B between which switches or other mechanisms known in the art may open and close. A contactor coil driver 3 may be any of a variety of coil drivers known in the art, e.g., a process controller, an automation controller, an auxiliary relay, a manual switch, a contactor contact, a relay contact, and a semiconductor driver. An AC power source 4 provides AC power to an AC power load 5 by way of the power contactor 2. Power contact line termination 67, 77, 87 and power contact terminal termination 68, 78, 88 provides electrical coupling for the arc suppressing circuit 1 across the power contactor 2. First and second contactor coil terminal terminations 91, 92 provide input to the arc suppressing circuit 1 of the operation of the coil driver 3.

Figure 2:
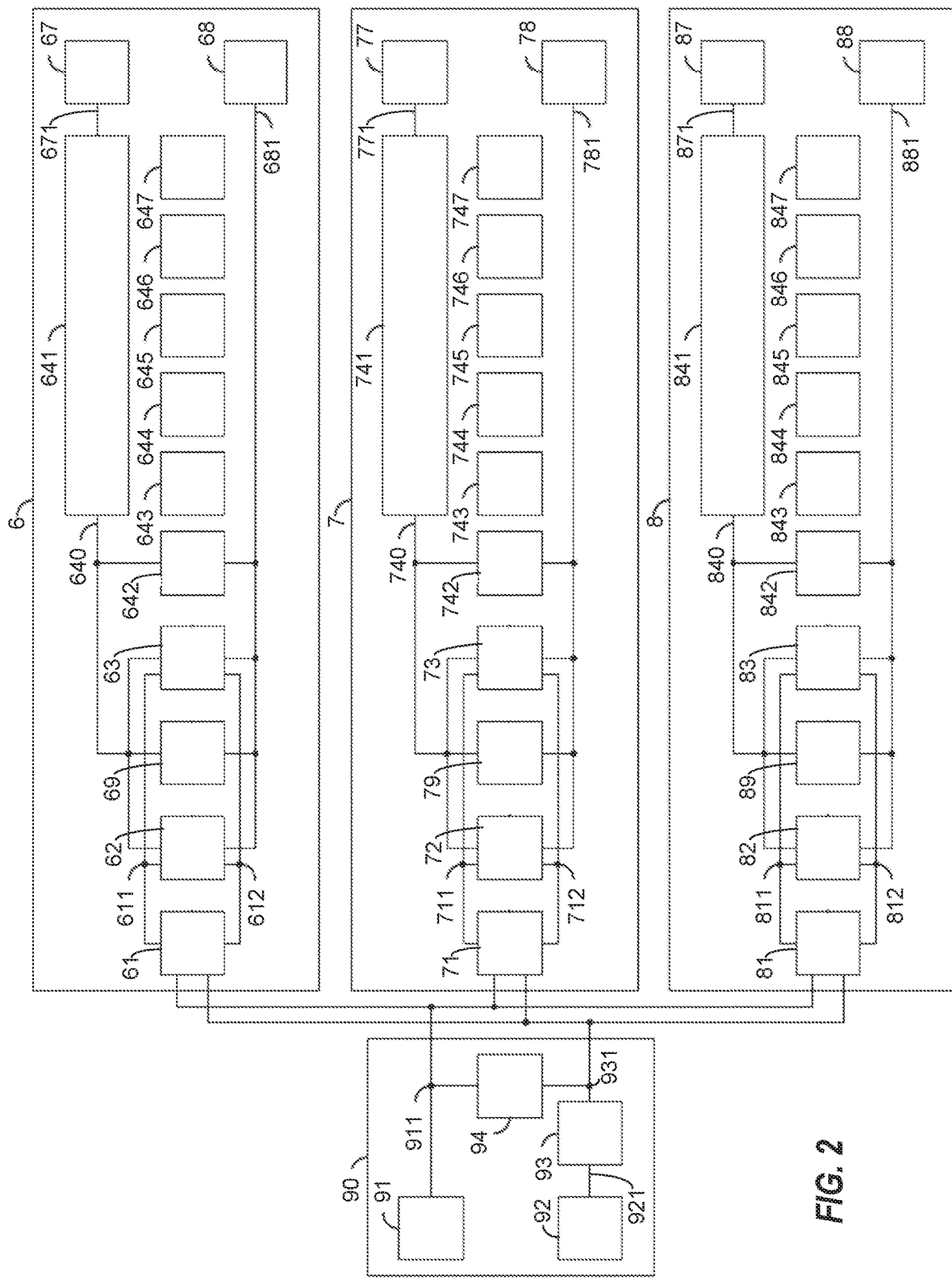
FIG. 2 is a block diagram of three dual unidirectional arc suppressors in antiparallel configuration, in an example embodiment.

FIG. 2 is a block diagram of three dual unidirectional arc suppressors in antiparallel configuration, in an example embodiment. The dual unidirectional arc suppressors are illustrated in specific implementations in other figures disclosed herein which may be incorporated on a block level where appropriate or desired. As such, it is contemplated that the various blocks of the arc suppressing circuit 1 may be implemented according to any permutation or combination of block implementations disclosed herein.

The arc suppressing circuit 1 includes three (3) dual unidirectional arc suppressors 6, 7, 8 in an antiparallel configuration. Each of the dual unidirectional arc suppressors 6, 7, 8 includes blocks that will be described in detail herein. Each block of each dual unidirectional arc suppressor 6, 7, 8 may be separately implemented within each dual unidirectional arc suppressor 6, 7, 8 according to the requirements of each dual unidirectional arc suppressor 6, 7, 8. However, it is to be recognized and understood that each related component of each dual unidirectional arc suppressor 6, 7, 8 may be implemented according to common principles, and that the discussion of one such component with respect to one dual unidirectional arc suppressor 6, 7, 8, e.g., a coil lock controller 61 of dual unidirectional arc suppressor 6, may be understood to correspond to the related component of a different dual unidirectional arc suppressor 6, 7, 8, i.e., the coil lock controller 71 of dual unidirectional arc suppressor 7 and the coil lock controller 81 of dual unidirectional arc suppressor 8.

While three-phase systems are detailed herein, it is to be recognized and understood that the principles disclosed with respect to three-phase systems may be applied to any single or multi-phase AC power system. More broadly, for any system with a predetermined number of phases, the arc suppressing circuit 1 may be implemented with as a number of dual unidirectional arc suppressors equal to the predetermined number of phases in the system in which the arc suppressing circuit 1 is being utilized. Moreover, it is noted that the arc suppressing circuit 1 may be utilized in a single phase AC or in a DC system.

Each dual unidirectional arc suppressor 6, 7, 8 includes a coil lock controller 61, 71, 81, respectively; a first, phase-specific single unipolar arc suppressor 62, 72, 82, respectively; and a second phase-specific single unipolar arc suppressor 63, 73, 83, respectively; coupled to one another at nodes 611, 711, 811, respectively, and nodes 612, 712, 812, respectively. Each dual unidirectional arc suppressor 6, 7, 8 further includes a second overvoltage protector 69, 79, 89, respectively, coupled to the first and second phase-specific single unipolar arc suppressors 62, 63, 72, 73, 82, 83, at node 640, 740, 840, respectively and nodes 681, 781, 881, respectively. Examples of the coil lock controllers 61, 71, 81, first, phase-specific single unipolar arc suppressor 62, 72, 82, and second phase-specific single unipolar arc suppressor 63, 73, 83, will be disclosed in detail herein. The second overvoltage protectors 69, 79, 89 may be or may be comprised of a varistor, a transient-voltage suppression (TVS) diode, a Zener diode, a gas tube, a spark gap, or any other related, suitable component to lock out the associated arc suppressor 6, 7, 8 when the associated arc suppressor 6, 7, 8 is not needed for arc suppression.

A fusible trace or fusible element 641, 741 841, respectively, may, over an extended length of the fusible element 641, 741 841, be void of organic material, such as solder mask, silkscreen, and the like. Additionally or alternatively, the fusible element 641, 741, 841 may include passive or active fuse elements known in the art. The fusible elements 641, 741, 841 are coupled to node 640, 740, 840, respectively. Finally, each dual unidirectional arc suppressor 6, 7, 8 includes a power contact line termination 67, 77, 87 coupled to node 671, 771, 871, respectively, and a power contact terminal termination 68, 78, 88, respectively, coupled to nodes 681, 781, 881, respectively.

Each dual unidirectional arc suppressor 6, 7, 8 is configured to operate at a separate phase in a three-phase system relative to one another. Thus, by way of illustrative example, if the first dual unidirectional arc suppressor 6 is configured to operate at zero degree phase, the second dual unidirectional arc suppressor 7 may be configured to operate at plus-one hundred twenty degrees out of phase with the first dual unidirectional arc suppressor 6 while the third dual unidirectional arc suppressor 8 may be configured to operate at negative-one hundred twenty degrees out of phase with the first dual unidirectional arc suppressor 8. (See FIG. 8.) In such an example, each dual unidirectional arc suppressor 6, 7, 8 is configured to receive one of three corresponding lines of a three-phase power line and suppress arcing on that line.

As will be illustrated herein, each dual unidirectional arc suppressor 6, 7, 8 is "dual" because each includes two separate are suppressors. In various examples, the dual unidirectional arc suppressor 6, 7, 8 may be "unidirectional" by being configured to operate from the power source to the load, i.e., in a single direction, rather than handling bidirectional current flow. While unidirectional arc suppressors are disclosed, the examples described herein may be implemented on any suitable arc suppressor dependent on the circumstances of use.

The arc suppressing circuit 1 further incorporates a coil interface 90. In the illustrated examples, the coil interface 90 includes: first and second contactor coil terminal terminations 91, 92; a coil power over current protection 93, which is coupled to the second contactor coil terminal termination 92 at node 921; and a coil power over voltage protection 94, which is coupled between nodes 911 and 931, which are coupled with the coil lock controllers 61, 71, 81. In an example, the coil power over current protection 93 is a resistor and the coil power over voltage protection 94 is a varistor, but it is to be recognized and understood that any suitable components may be in the coil power over current protection 93 and over voltage protection 94. The coil interface 90 is configured to receive an output condition of the contactor coil driver 3 and output a signal based on the output condition to the coil lock controllers 61, 71, 81.

The arc suppressing circuit 1 may be implemented as hardware according to any suitable method or mechanism, including as a single component substrate or printed circuit board, a common motherboard, and/or as separate daughter boards. An internal shield or shielding system may incorporate shielding features 643, 644, 743, 744, 843, 844, such as deflectors, baffles, and/or blow holes, or slots to control, guide, and dissipate shock waves. The shielding features 643, 644, 743, 744, 843, 844 may, in an example, be made in whole or in part from 0.3556 millimeter (0.014 inch) thick FR4 fiberglass. The arc suppressing circuit 1 may further include trace barriers 645, 646, 745, 746, 845, 846 and plasma blast shields 647, 747, 847. The shielding components collectively 643, 644, 645, 646, 647, 743, 744, 745, 746, 747, 843, 844, 845, 846, 847 may act to catch and contain detritus and may act as a sublimate receptor.

In various examples, a fuse (see FIGS. 9A-9C) may be incorporated on a bottom, i.e., unpopulated side of an enclosure of the arc suppressing circuit 1. In such an example, the fuse may not incorporate a conformal mask or conformal coating. Incorporation of the fuse on the bottom side may help isolate resultant debris in the event of failure of the fuse from other components while also providing relative ease of manufacturing owing to access for soldering or other coupling or attachment mechanisms. An epoxy silkscreen bridge may minimize solder creep into the fuse. The fuse is inline with the quick-connect terminal (QCT) tab and circuitry of the arc suppressing circuit 1 to minimize vaporized copper on proximate components.

The are suppressing circuit 1 may incorporate various physical and electrical separation features as well as dielectric isolation features, which are described in FIGS. 9A-9C. Dielectric isolation may include phase separation of at least one thousand five hundred (1,500) Volt dielectric isolation between each phase in a conventional one hundred twenty (120) Volt application, but it is to be recognized and understood that the dielectric isolation may be set according to the use in which the arc suppressing circuit 1 is being used.

Figure 3:
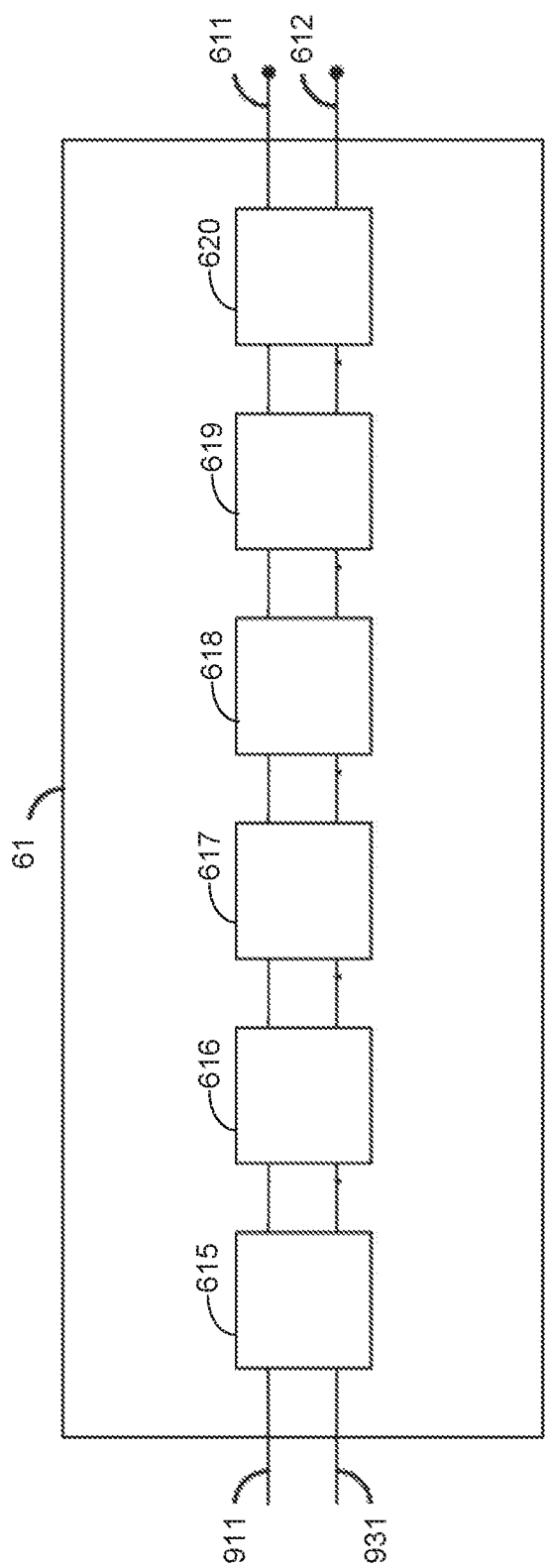
FIG. 3 is a block diagram of a coil lock controller, in an example embodiment.

FIG. 3 is a block diagram of a coil lock controller, in an example embodiment. The coil lock controller 61 may be implemented as any one or all of the coil lock controllers 61, 71, 81 of the dual unidirectional arc suppressors 6, 7, 8. The coil lock controller 61 includes a power converter 615, a rectifier 616, a power limiter 617, a power storage 618, a current supply 619, and, optionally, an enabled indicator 620. The enabled indicator 620 may provide an external indication that the coil lock controller 61 and the associated dual unidirectional arc suppressor 6, 7, 8 generally is in an enabled state and ready to suppress contact arcing. The enabled indicator 1 may be an interface, such as a user interface, e.g., a light emitting diode (LED) or other light source, or an input/output (I/O) port, such as an external connection, internal communication link via microprocessor or microcontroller to communicate with external equipment via wired or wireless modalities.

The coil power converter 615 may function as a regulator and/or limiter on the input power to the coil lock controller 61. In an example, the coil power converter 615 may be comprised of a capacitor in series with a resistor. The capacitor may pass AC current and block DC current. The resistor may limit inrush and steady state current. However, the coil power converter 615 may be implemented with any hardware that may regular and/or limit input power.

The rectifier 616 may be or may include diodes, valves, bridge rectifiers, and the like. The power limiter 617 may be or may include a Zener diode, a TVS, a varistor, and the like. The current supply 619 may be any suitable current source, including a voltage supply that incorporates a current limiter.

The power storage 618 may be a holdover power storage device to hold over from the contactor coil driver 3 for a relatively short period of time, e.g., one hundred milliseconds to three hundred milliseconds, in order to keep the coil lock controller 61 in an unlocked state for a predetermined time sufficient to allow the contactor coil driver 3 to de-energize and allow time for the power contactor 2 to break or make contact, as will be illustrated herein. In various examples, the power storage 618 may be or may include a microprocessor or other controller to control an actual holdover time, i.e., may provide active holdover power control, in contrast to components that may provide passive holdover power control, as disclosed herein.

Figure 4:
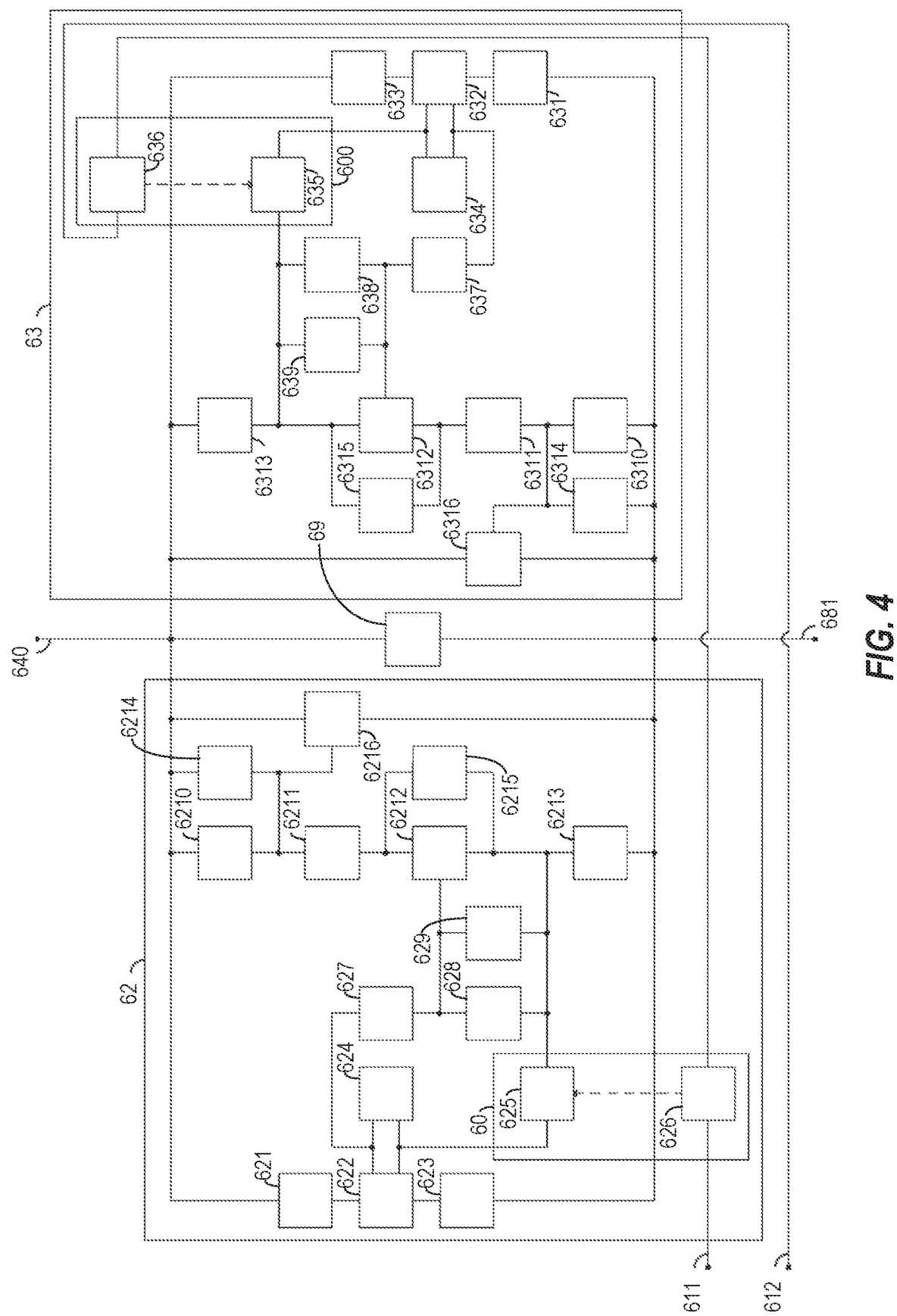
FIG. 4 is a block diagram of example first and second phase-specific arc suppressors, in an example embodiment.

FIG. 4 is a block diagram of example first and second phase-specific arc suppressors, in an example embodiment. The first phase-specific arc suppressor 62 may be implemented as any one or more of the first phase-specific single unipolar arc suppressors 72, 82. The second phase-specific arc suppressor 63 may be implemented as any one or more of the second phase-specific single unipolar arc suppressors 73, 83. Thus, in various examples, the blocks described with respect to the first and second phase-specific arc suppressors 62, 63 may be implemented in the same way as the other first and second phase-specific arc suppressors 72, 73, 82, 83, with their roles determined by how they are wired with respect to one another and the other system components. Alternatively, the various blocks may be implemented in different ways between and among the various first and second phase-specific arc suppressors 62, 63, 72, 73, 82, 83.

In examples where the first and second phase-specific arc suppressors 62, 63 are implemented as the first and second phase-specific arc suppressors 72, 73, the node 611 is instead coupled to node 711, the node 612 is instead coupled to node 712, the node 640 is instead coupled to node 740, and the node 681 is instead coupled to node 781, as shown in FIG. 2. In examples where the first and second phase-specific arc suppressors 62, 63 are implemented as the first and second phase-specific arc suppressors 82, 83, the node 611 is instead coupled to node 811, the node 612 is instead coupled to node 812, the node 640 is instead coupled to node 840, and the node 681 is instead coupled to node 881, as shown in FIG. 2.

Figure 8:
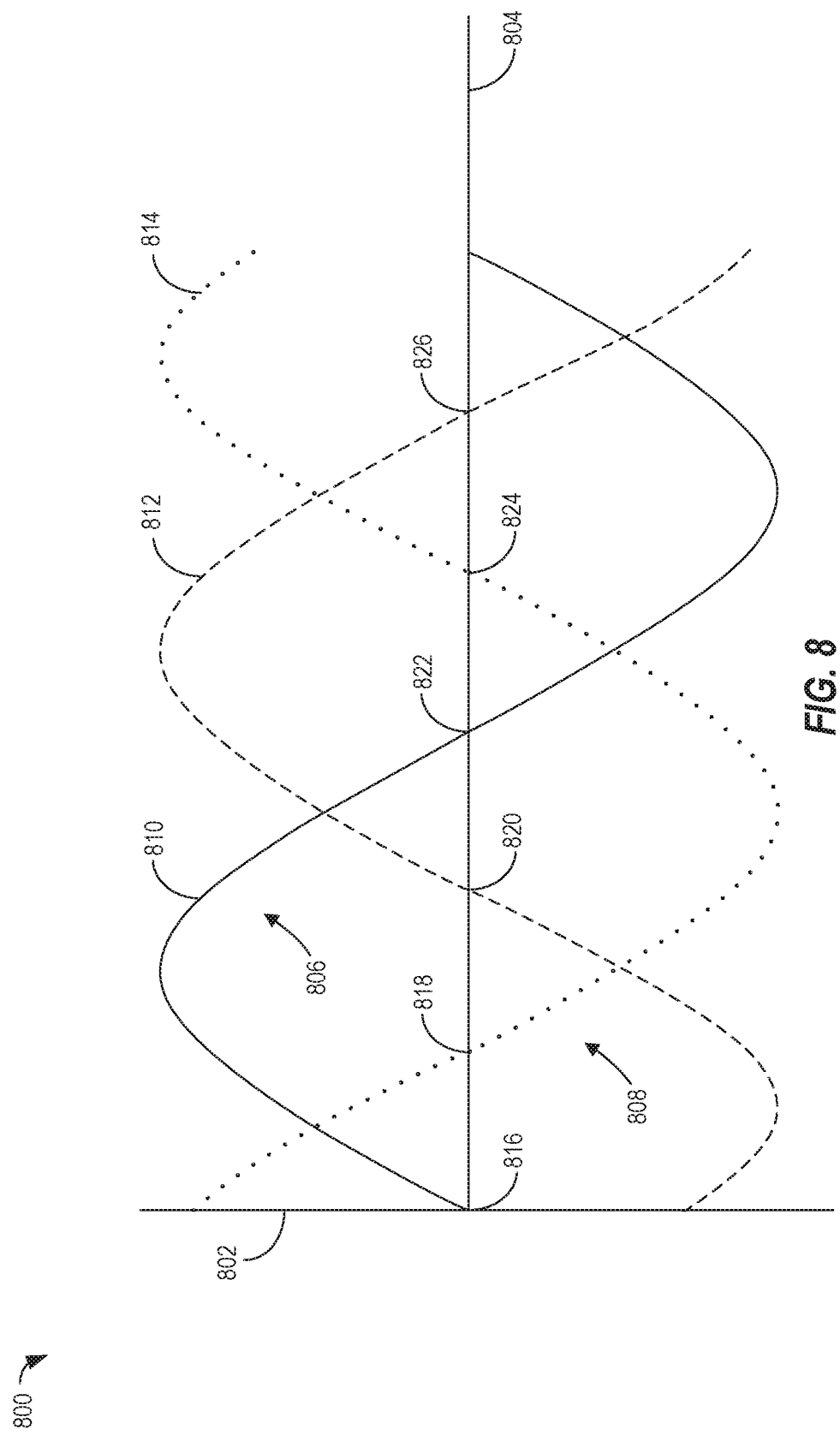
FIG. 8 illustrates an operation of an arc suppressor circuit illustrated using a waveform 800 for a three-phase power system, in an example embodiment.

For the purposes of illustration, the first phase-specific arc suppressor 62 is configured to suppress contact arcing for positive halfwaves of AC current, i.e., the portion of the current above the zero-degree phase line of a sinusoidal AC current as illustrated in FIG. 8. The second phase-specific arc suppressor 63 is configured to suppress contact arcing for negative, i.e., the portion of the current below the zero-degree phase line of the sinusoidal AC current, as illustrated in FIG. 8.

In the illustrated example, the first and second phase-specific arc suppressors 62, 63 each respectively include the following components:

A signal edge detector 621, 631 is configured to generate an output based on receiving a change in a voltage signal from the contacts indicative of a contact separation event or a plasma ignition event. In various examples, the signal edge detector may be any component or components that produce a change in output based on receipt of a voltage edge.

An edge-pulse converter 622, 632, is configured to convert the voltage edge from the signal edge detector 621, 631, respectively, to a digital pulse. The edge-pulse converter 622, 632 may be a transformer, pulse transformer, gate trigger, or any other suitable component.

A current limiter 623, 633, is configured to limit the current through the signal edge detector 621, 631, respectively, and edge-pulse converter 622, 632, respectively. The current limiter 623, 633 may be a relatively high impedance component or components, such as a resistor.

A first over voltage protection 624, 634 prevents excessive voltage from propagating through the first and second phase-specific arc suppressors 62, 63, respectively. The first over voltage protection 624, 634 may be a varistor, a TVS diode, a Zener diode, a gas tube, a spark gap, or any other related, suitable component.

A coil lock 60, 600 is configured to disable the first and second phase-specific arc suppressors 62, 63, respectively, when one or both of the first and second phase-specific arc suppressors 62, 63 are subjected to a fast input voltage rising edge during the initial supply of power to the contact that the first and second phase-specific arc suppressors 62, 63 are connected across. In the illustrated example, the coil locks 60, 600 include a signal isolator detector 625, 635, respectively, and a signal isolator emitter 626, 636, respectively. In various examples, those parts of the coil locks 60, 600 may be implemented as a single component, such as a photorelay, or as separate components.

Current valves 627, 628, 637, 638 are configured to enable current flow in only one direction, such as a diode rectifier, tube valve, and so forth.

Signal terminators 629, 639 may be any component with suitable impedance, such as a resistor.

A latching switch 6212, 6312, is configured to engage or disengage its respective first and second phase-specific arc suppressors 62, 63 based on the input to the gate of the latching switch 6212, 6312 being positive or negative. In such an example, owing to the differing phases of the first and second phase-specific arc suppressors 62, 63, only one latching switch 6212, 6312 allows current to pass through at a time, limiting the operation to only one of the first and second phase-specific arc suppressors 62, 63 at a time. As such, in an example, the latching switches 6212, 6312 are thyristors or related devices such as TRIACs or silicon controlled rectifiers (SCRs).

In the illustrated example, the first and second phase-specific arc suppressors 62, 63 each respectively include the following optional components which may be utilized in circumstances in which the first and second phase-specific arc suppressors 62, 63 are designed for relatively high current conditions, e.g., at least one (1) kiloampere:

A current valve 6210, 6310. Current limiters 6211, 6213, 6311, 6313. Signal termination 6214, 6314. Over voltage protection 6215. A trigger latching valve 6216, 6316, such as a thyristor, TRIAC, SCR, and so forth.

Finally, the first and second phase-specific arc suppressors 62, 63 share a second over voltage protector 69.

Figure 5:
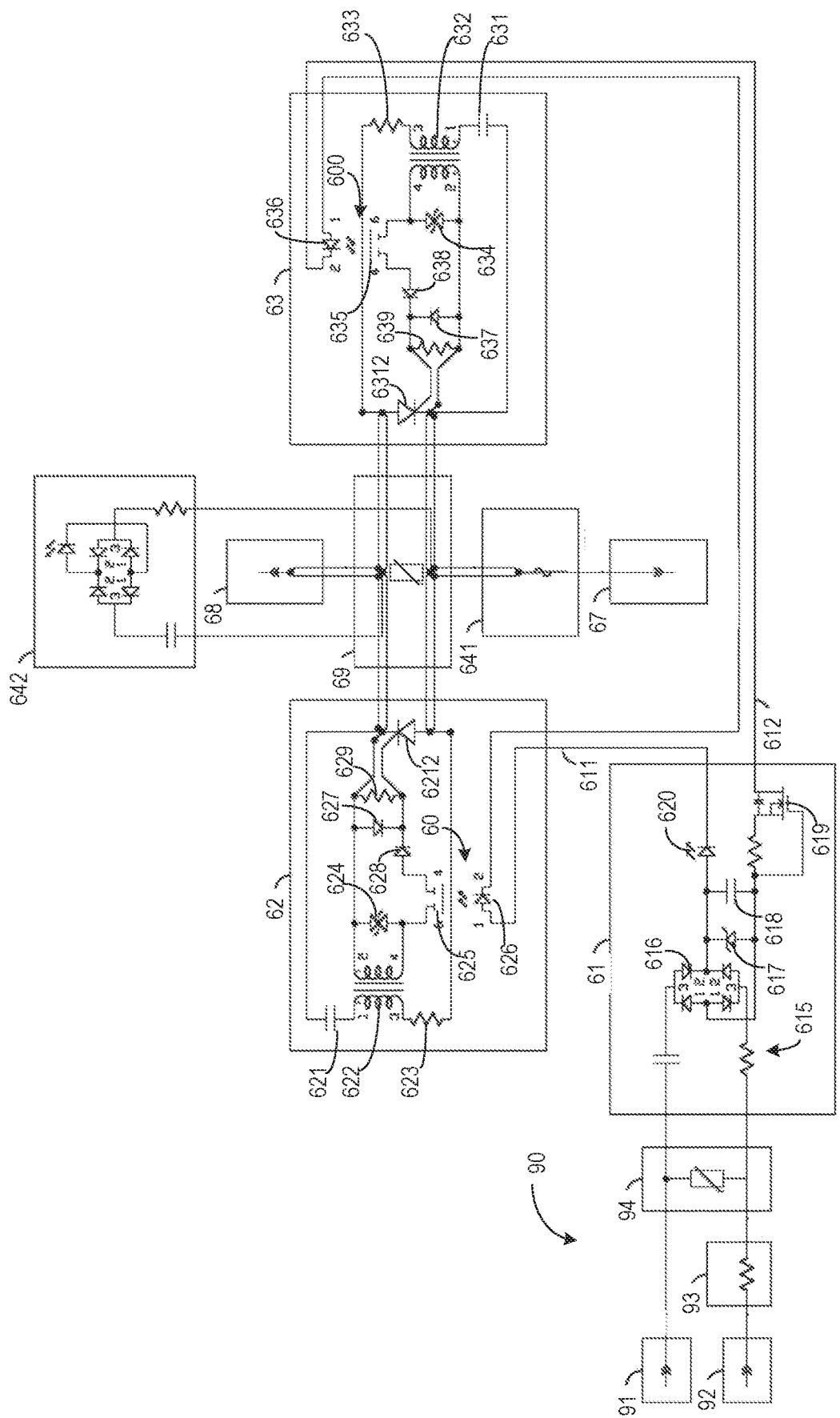
FIG. 5 is a circuit diagram of an example implementation of first and second phase-specific arc suppressors and other components of a dual unidirectional arc suppressor, in an example embodiment.

FIG. 5 is a circuit diagram of an example implementation of the first and second phase-specific arc suppressors 62, 63 and other components of the dual unidirectional arc suppressor 6, in an example embodiment. As with the block diagram of FIG. 4, it is to be recognized and understood that the specific implementation of the dual unidirectional arc suppressor 6 may also be implemented as the dual unidirectional arc suppressors 7, 8, as adjusted for the various nodes to which those dual unidirectional arc suppressors 7, 8 are coupled, as shown in FIG. 2.

In the illustrated example, the coil interface 90 includes the coil terminals 91, 92; the coil over current protection 93 as a ten (10) Ohm resistor; and the coil over voltage protection 94 as a four hundred seventy (470) Volt, four hundred (400) Ampere varistor.

In the illustrated example, the coil lock controller 61 includes the power converter 615 as a parallel one thousand (1.000) Ohm resistor and a 0.1 microfarad, six hundred thirty (630) Volt ceramic capacitor; the rectifier 616 as one hundred (100) Volt, two hundred fifteen (215) milliampere diode arrays; the power limiter 617 as an eighteen (18) Volt Zener diode; the power storage 618 as a one hundred (100) microfarad, twenty-five (25) Volt aluminum electrolytic capacitor; and the current supply 619 as a six hundred (600) Volt N-channel MOSFET transistor.

In the illustrated example, the first and second phase-specific arc suppressors 62, 63 each include, respectively:

The signal edge detector 621, 631 as a 0.022 microfarad one (630) kilovolt capacitor; the pulse edge converter 622, 632 as a two coil, ten (10) microhenry inductor array; the current limiter 623, 633 as a ten (10) Ohm resistor; the first over voltage protection 624, 634 as a six (6) Volt TVS; the coil lock 60, 600 as a two (2) Ampere, forty (40) Volt photorelay; the current valves 627, 628, 637, 638 as three hundred (300) Volt, one (1) Ampere diodes; the signal terminators 629, 639 as one hundred (100) Ohm resistors; and the latching switch 6212, 6312 as a non-isolated, one (1) kilovolt, fifty-five (55) Ampere SCR.

In the illustrated example, the second over voltage protector 69 is an eight hundred twenty (820). 1.2 kiloampere varistor. The fusible element 641 and power contact line termination 67, 68 are provided for the purposes of illustration. A ready indicator 642 in the form of a light emitting diode is also provided.

Figure 6:
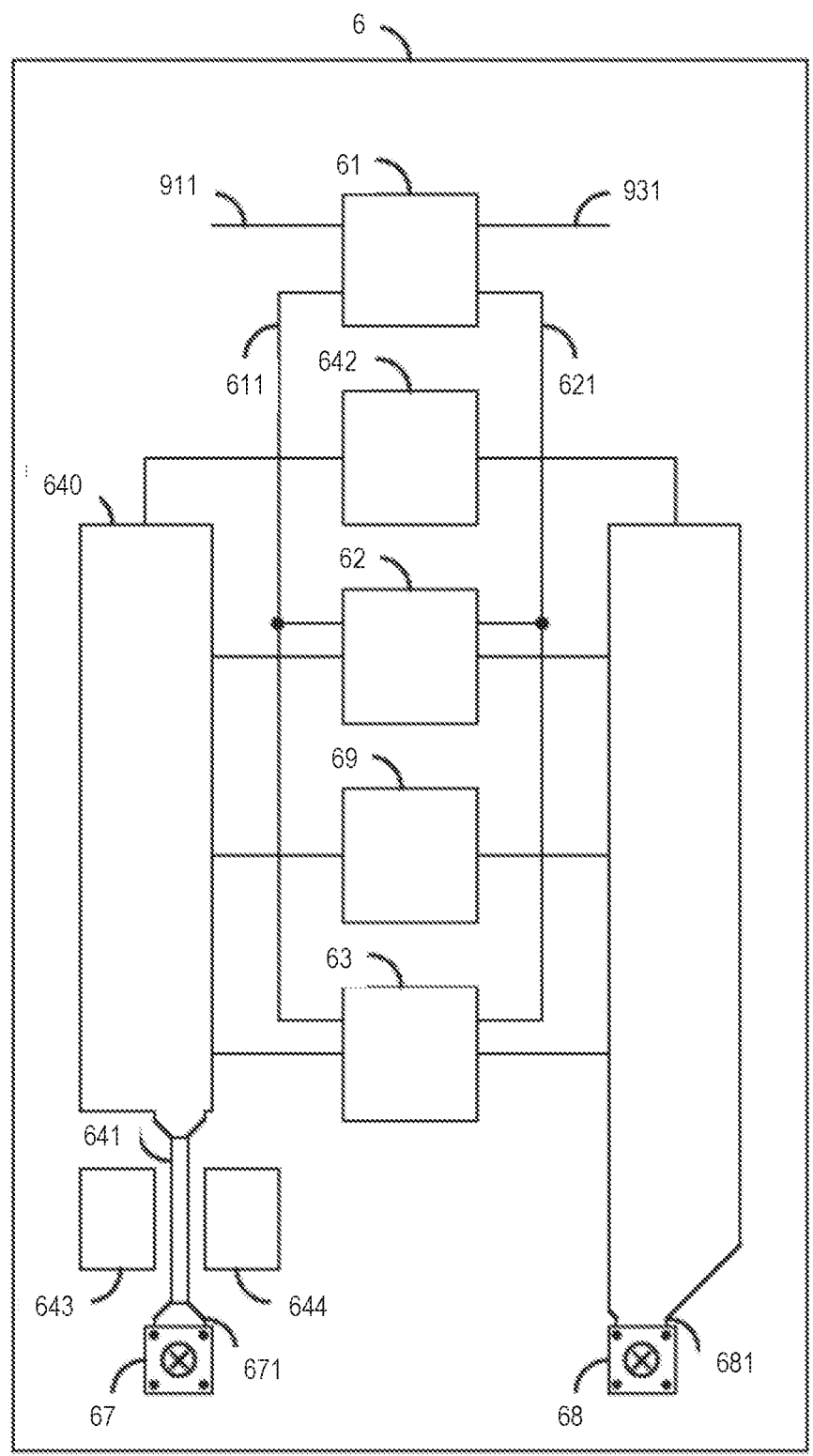
FIG. 6 is a block diagram of a dual unidirectional arc suppressor, in an example embodiment.

FIG. 6 is a block diagram of the dual unidirectional arc suppressor 6, in an example embodiment. The block diagram illustrates the topology features of the dual unidirectional arc suppressor 6 in relation to the various blocks disclosed herein. In particular, nodes 640 and 681 are implemented as conduction and cooling structures and are physically wider than a conventional trace. The shielding features 643, 644 bracket the fusible element 641 to contain any physical consequence of a failure of the fusible element 641. The relative positioning of the various blocks 61, 62, 63, 69, 642 and nodes 611, 621, 671, 911, 931 may be representative of the positioning of those blocks and nodes in an implemented board or finished product.

Figure 7A:
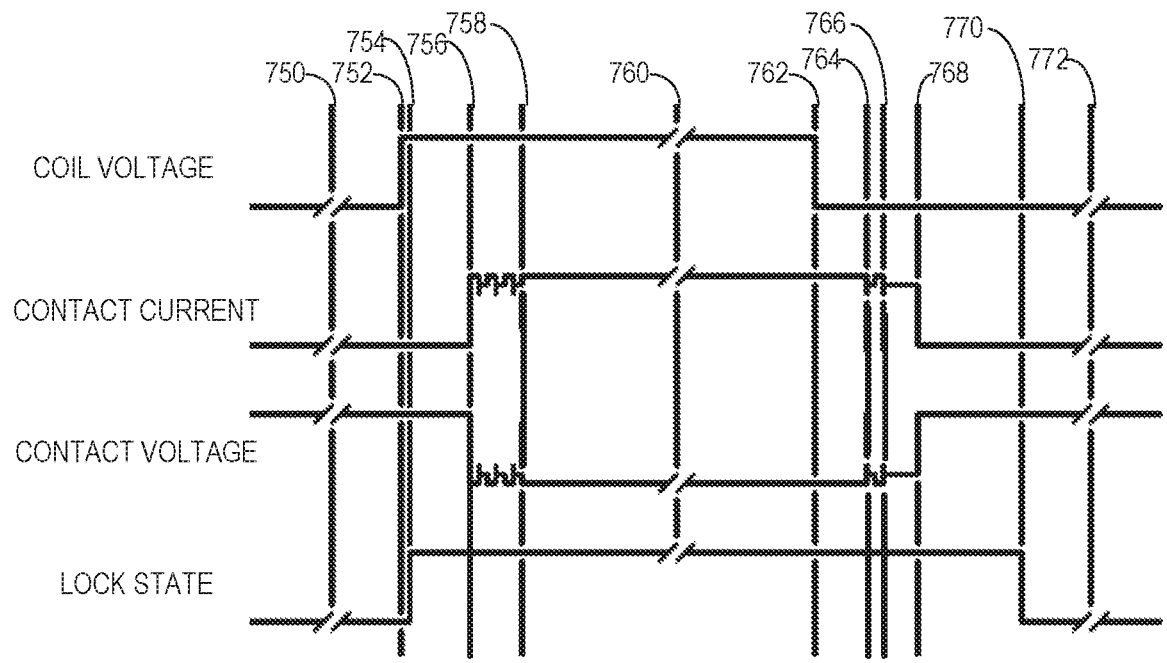
FIGS. 7A and 7B are timing diagrams for an arc suppressing circuit, in example embodiments.
Figure 7B:
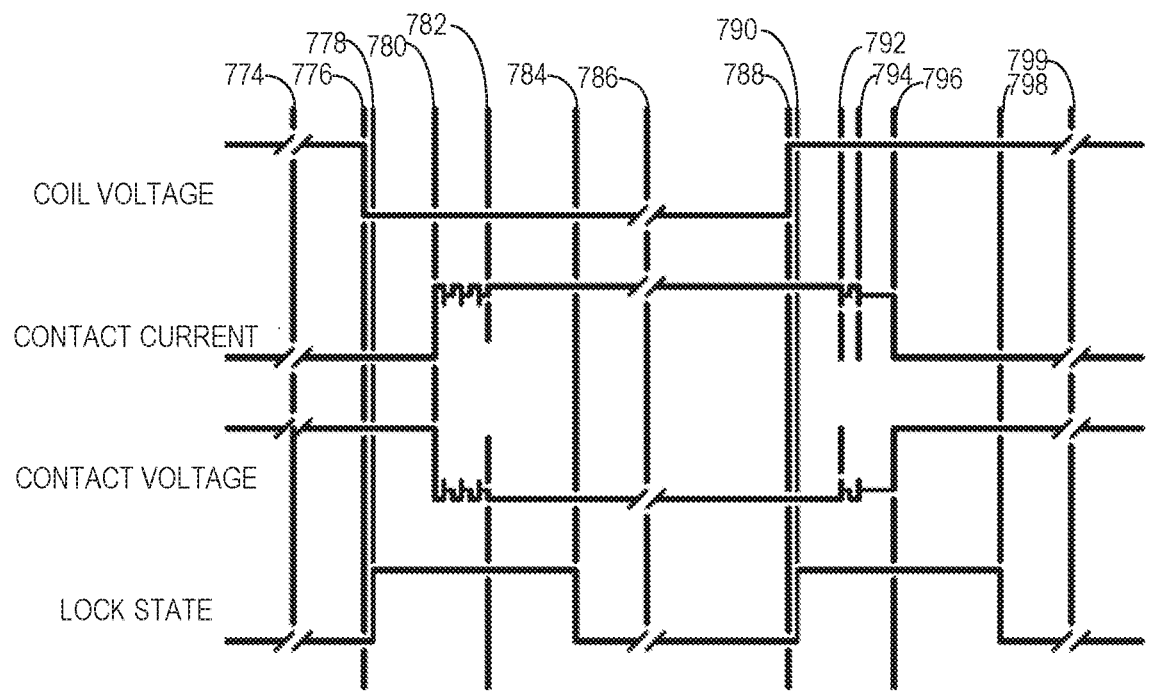

FIGS. 7A and 7B are timing diagrams for the arc suppressing circuit 1, in example embodiments. In general, the timing diagrams illustrate signals as detected by or transmitted from the coil lock controller 61, 71, 81 of the respective dual unidirectional arc suppressors 6, 7, 8 and current and voltage over the contacts of the power contactor 2. The timing diagrams proceed over time from left to right.

The timing diagram of FIG. 7A depicts the operation of the arc suppressing circuit 1 when the power contact 2 is a normally-open, e.g., Form A, power contact. At 750, the system is in a base state, with the coil voltage low, the contact current low, the contact voltage high, and the lock state of the coil lock circuit 61, 71, 81 low or "locked", inhibiting operation of the arc suppressing circuit 1. At 752, the coil voltage from the contactor coil driver 3 rises to high, indicating an impending closing of the contact 2, and providing a high voltage across the input nodes 911, 931 to the coil lock circuits 61, 71, 81. At 754, the coil lock circuits 61, 71, 81 output on the output nodes 611, 612 a high, unlock signal enabling operation of their respective dual unidirectional arc suppressors 6, 7, 8.

At 756, the current rises and the voltage falls across the power contactor 2 as the contacts close, causing the activation of the dual unidirectional arc suppressors 6, 7, 8 to suppress resultant arcing. Between 756 and 758, arclets form and are suppressed by the dual unidirectional arc suppressors 6, 7, 8. The phenomenon of arclets is discussed in U.S. Pat. No. 9,423,442, Henke, which is incorporated herein in its entirety. At 758, owing to the operation of the dual unidirectional arc suppressors 6, 7, 8, the arclets are no longer forming and arcing across the power contactor 2 has been suppressed. The power contactor 2 remains closed over 760 and the arc suppressing circuit 1 is not suppressing any arcing across the contacts.

At 762, the contactor coil driver 3 voltage rises, signaling an impending opening of the power contactor 2. At 764, resultant arclets begin, are suppressed by the dual unidirectional arc suppressors 6, 7, 8, and last until 766, where the current has partially fallen and the voltage has partially risen. At 768, the power contactor 2 is opened, the current is low and the voltage high across the power contactor 2. At 770, with the voltage low across the input nodes 911, 931 to the coil lock circuits 61, 71, 81, the output nodes 611, 612 go to a low, locked state. At 772, the system has returned to the base state as at 750.

The timing diagram of FIG. 7B depicts the operation of the arc suppressing circuit 1 when the power contact 2 is a normally-closed, e.g., Form B, power contact. As will be seen, as a practical matter, the difference in operation of the arc suppressing circuit 1 with a Form B power contact is that the coil lock circuits 61, 71, 81 return to a locked state when the power contactor 2 is closed after suppressing arcing across the power contactor 2 as the power contactor 2 open, but is then unlocked again when the power contactor 2 is opened.

At 774, the system is in a base state, with the coil voltage high, the contact current low, the contact voltage high, and the lock state of the coil lock circuit 61, 71, 81 low or "locked", inhibiting operation of the arc suppressing circuit 1. At 776, the coil voltage from the contactor coil driver 3 drops to low, indicating an impending closing of the contact 2, and providing a low voltage across the input nodes 911, 931 to the coil lock circuits 61, 71, 81. At 778, the coil lock circuits 61, 71, 81 output on the output nodes 611, 612 a high, unlock signal enabling operation of their respective dual unidirectional arc suppressors 6, 7, 8.

At 780, the current rises and the voltage falls across the power contactor 2 as the contacts close, causing the activation of the dual unidirectional arc suppressors 6, 7, 8 to suppress resultant arcing. Between 780 and 782, arclets form and are suppressed by the dual unidirectional arc suppressors 6, 7, 8. At 782, owing to the operation of the dual unidirectional arc suppressors 6, 7, 8, the arclets are no longer forming and arcing across the power contactor 2 has been suppressed. The power contactor 2 remains closed at 784 and, owing to the low coil voltage, high current, and low contact voltage, the coil lock circuits 61, 71, 81 output a low, locked signal on their output nodes 611, 612. The power contactor 2 remains closed over 786 and the arc suppressing circuit 1 is not suppressing any arcing across the contacts.

At 788, the contactor coil driver 3 voltage rises, signaling an impending opening of the power contactor 2. At 790, the coil lock circuits 61, 71, 81 output on the output nodes 611, 612 a high, unlock signal, enabling operation of their respective dual unidirectional arc suppressors 6, 7, 8. At 792, resultant arclets begin, are suppressed by the dual unidirectional arc suppressors 6, 7, 8, and last until 794, where the current has partially fallen and the voltage has partially risen. At 796, the power contactor 2 is opened, the current is low and the voltage high across the power contactor 2. At 798, with the voltage low across the input nodes 911, 931 to the coil lock circuits 61, 71, 81, the output nodes 611, 612 go to a low, locked state. At 799, the system has returned to the base state as at 774.

FIG. 8 illustrates an operation of the arc suppressing circuit 1 illustrated using a waveform 800 for a three-phase power system, in an example embodiment. It is noted that while three-phase AC power has been utilized for illustrative purposes, the principles disclosed herein apply as well to any AC power system, including single phase systems and non-three phase multi-phase systems. The Y-axis 802 shows voltage or current amplitude relative to the phase in degrees along the X-axis or zero line 804. For the purposes of this disclosure, the positive domain 806 is all space above the zero line 804, while the negative domain 808 is all space below the zero line 804.

For the purposes of this illustration, the first curve 810 represents the input to the dual unidirectional arc suppressor 6, the second curve 812 represents the input to the dual unidirectional arc suppressor 7, and the third curve 814 represents the input to the dual unidirectional arc suppressor 8. For each dual unidirectional arc suppressor 6, 7, 8, when the input is in the positive domain 806 the first phase-specific arc suppressor 62, 72, 82, respectively, is active or potentially active while the second phase-specific arc suppressor 63, 73, 83, respectively, is inactive. For each dual unidirectional arc suppressor 6, 7, 8, when the input is in the negative domain 806 the first phase-specific arc suppressor 62, 72, 82, respectively, is inactive while the second phase-specific arc suppressor 63, 73, 83, respectively, is active or potentially active. As noted herein, the switch from active to inactive or vice versa occurs because the trigger latch switch 6212, 6312 goes from conducting to non-conducting or vice versa when the input crosses the zero line 804.

At 816, the first curve 810 is crossing the zero line 804, and the second phase-specific arc suppressor 63 is switching from active to inactive and the first arc suppressor is switching from inactive to active. The second curve 812 is in the negative domain 808 and the second phase-specific arc suppressor 73 is active and the first phase-specific arc suppressor 72 is inactive. The third curve is in the positive domain 806 and the first phase-specific arc suppressor 82 is active and the second phase-specific arc suppressor 83 is inactive.

At 818, the third curve 814 crosses the zero line 804 into the negative domain 808, and the first phase-specific arc suppressor 82 becomes inactive and the second phase-specific arc suppressor 83 becomes active. The other two dual unidirectional arc suppressors 6, 7, do not change their operating state.

At 820, the second curve 812 crosses the zero line 804 into the positive domain 806, and the first phase-specific arc suppressor 72 becomes active and the second phase-specific arc suppressor 73 becomes inactive. The other two dual unidirectional arc suppressors 6, 8, do not change their operating state.

At 822, the first curve 810 crosses the zero line 804 into the negative domain 808, and the first phase-specific arc suppressor 62 becomes inactive and the second phase-specific arc suppressor 63 becomes active. The other two dual unidirectional arc suppressors 7, 8, do not change their operating state.

At 824, the third curve 814 crosses the zero line 804 into the positive domain 806, and the first phase-specific arc suppressor 82 becomes active and the second phase-specific arc suppressor 83 becomes inactive. The other two dual unidirectional arc suppressors 6, 7, do not change their operating state.

At 826, the second curve 812 crosses the zero line 804 into the negative domain, and the first phase-specific arc suppressor 72 becomes inactive and the second phase-specific arc suppressor 73 becomes active. The other two dual unidirectional arc suppressors 6, 8, do not change their operating state.

FIGS. 9A-9C are perspective views of an implementation of the dual unidirectional arc suppressor 6, in an example embodiment.

FIG. 9A is a view of the underside 900 of a printed circuit board (PCB) 902 including components of the dual unidirectional arc suppressor 6 (not pictured). As an example, a chip 904 or other block includes the coil lock circuit 61, the first phase-specific arc suppressor 62, the second phase-specific arc suppressor 63, and the ready indicator 642. The power contact line termination 67 and the power contact terminal termination 68 bracket either end of the PCB 902. The fusible trace 641 is bracketed on each short end by dielectric barriers 645, 646 and along each long side by shielding elements 643, 644. The dielectric barriers 645, 646 may be of insulating materials, such as epoxy paint, silicone, and the like. The shielding elements 643, 644 may provide venting and a dissipation mechanism for a supersonic plasma blast shockwave from the fusible trace 641. The fusible trace 641 is further covered by a plasma blast shield 647.

FIGS. 9B and 9C are side perspectives of the PCB 902 to illustrate an air gap 906 between the underside 900 of the PCB 902 and the plasma blast shield 647. The plasma blast shield 647 may be situated on a housing or may be held by standoffs or any other mechanism sufficient to provide and maintain the air gap 906.

Additional Examples

The description of the various embodiments is merely exemplary in nature and, thus, variations that do not depart from the gist of the examples and detailed description herein are intended to be within the scope of the present disclosure.

Such variations are not to be regarded as a departure from the spirit and scope of the present disclosure.

Example 1 is an arc suppressing circuit configured to suppress arcing across a power contactor coupled to an alternating current (AC) power source having a predetermined number of phases, each contact of the power contactor corresponding to one of the predetermined number of phases, the arc suppressing circuit comprising: a number of dual unidirectional arc suppressors equal to the predetermined number of phases of the AC power source, each dual unidirectional arc suppressor coupled across the power contactor, each dual unidirectional arc suppressor comprising: a first phase-specific arc suppressor configured to suppress arcing across the associated contacts in a positive domain; a second phase-specific arc suppressor configured to suppress arcing across the associated contacts in a negative domain; and a coil lock controller, configured to be coupled between a contact coil driver of the power contactor, configured to detect an output condition from the contact coil driver and inhibit operation of the first and second phase-specific arc suppressors over a predetermined time.

In Example 2, the subject matter Example 1 includes, wherein the first phase-specific arc suppressor is configured to not suppress arcing in the negative domain and the second phase-specific arc suppressor is configured to not suppress arcing in the positive domain.

In Example 3, the subject matter of any one or more of Examples 1 and 2 includes, wherein each of the first and second phase-specific arc suppressors comprise a latching switch configured to cause the first and second phase-specific arc suppressors to not suppress arcing in the negative and positive domains, respectively.

In Example 4, the subject matter of any one or more of Examples 1-3 includes, wherein the latching switch is a thyristor.

In Example 5, the subject matter of any one or more of Examples 1-4 includes, wherein the coil lock controller comprises: a power converter coupled over a coil interface; a rectifier coupled to the power converter; a power limiter coupled to the rectifier; a power storage coupled to the power limiter; and a current supply coupled to the power storage, the current supply coupled to the first phase-specific arc suppressor and the second phase-specific arc suppressor.

In Example 6, the subject matter of any one or more of Examples 1-5 includes, wherein the power converter comprises an RC circuit, the rectifier comprises a diode array, the power limiter comprises a Zener diode; the power storage comprises a capacitor; and the current supply comprises a MOSFET transistor.

In Example 7, the subject matter of any one or more of Examples 1-6 includes, wherein each of the first and second phase-specific arc suppressors comprise a coil lock, coupled to the coil lock controller, configured to disable a respective one of the first and second phase-specific arc suppressors based on an input from the coil lock controller.

In Example 8, the subject matter of any one or more of Examples 1-7 includes, wherein the coil lock comprises a signal isolator emitter coupled to the coil lock controller and a signal isolator detector coupled to the latching switch.

In Example 9, the subject matter of any one or more of Examples 1-8 includes, wherein the coil lock is a photorelay comprising the signal isolator emitter and the signal isolator detector.

In Example 10, the subject matter of any one or more of Examples 1-9 includes, wherein each of the first and second phase-specific arc suppressors comprises: a signal edge detector; an edge-pulse converter in series with the signal edge detector; a current limiter in series with the edge-pulse converter; and a first over voltage protection coupled to the edge-pulse converter and the signal isolator detector of the coil lock.

In Example 11, the subject matter of any one or more of Examples 1-10 includes, wherein the edge-pulse converter is at least one of: a transformer; a pulse transformer; or a gate trigger.

In Example 12, the subject matter of any one or more of Examples 1-11 includes, wherein each of the dual unidirectional arc suppressors further comprises: a first contact terminal configured to be electrically coupled to a first contact of the power contactor; a second contact terminal configured to be coupled to be electrically coupled to a second contact of the power contactor, the second contact terminal coupled to the first phase-specific arc suppressor, the second phase-specific arc suppressor, and the coil lock controller; and a fusible element coupled between the first contact terminal and the first phase-specific arc suppressor, the second phase-specific arc suppressor, and the coil lock controller.

In Example 13, the subject matter of any one or more of Examples 1-12 includes, wherein the fusible element is one of: a solder mask, a silkscreen, a passive fuse, or an active fuse.

In Example 14, the subject matter of any one or more of Examples 1-13 includes, wherein each of the dual unidirectional arc suppressors further comprises a second over voltage protector coupled over the first phase-specific arc suppressor, the second phase-specific arc suppressor, and the coil lock controller.

In Example 15, the subject matter of any one or more of Examples 1-14 includes, wherein the second over voltage protector comprises at least one of: variostor, a transient-voltage suppression (TVS) diode, a Zener diode, a gas tube, or a spark gap.

Example 16 is a three-phase arc suppressing circuit, comprising: a coil interface, configured to be coupled to a contactor coil driver of a power contactor and to receive an output condition of the contactor coil driver and output a signal based on the output condition; a first dual unidirectional arc suppressor configured to be coupled to contacts at a first phase, comprising: a first phase-specific arc suppressor configured to suppress arcing in a positive domain; a second phase-specific arc suppressor configured to suppress arcing in a negative domain; and a coil lock controller, coupled to the coil interface, configured to inhibit operation of the first and second phase-specific arc suppressors over a predetermined time based on the signal from the coil interface; a second dual unidirectional arc suppressor configured to be coupled to contacts at a second phase one hundred and twenty degrees greater than the first phase, comprising: a first phase-specific arc suppressor configured to suppress arcing in the positive domain; a second phase-specific arc suppressor configured to suppress arcing in the negative domain; and a coil lock controller, coupled to the coil interface, configured to inhibit operation of the first and second phase-specific arc suppressors over a predetermined time based on the signal from the coil interface; and a third dual unidirectional arc suppressor configured to be coupled to contacts at a third phase one hundred and twenty degrees less than the first phase, comprising: a first phase-specific arc suppressor configured to suppress arcing in the positive domain; a second phase-specific arc suppressor configured to suppress arcing in the negative domain; and a coil lock controller, coupled to the coil interface, configured to inhibit operation of the first and second phase-specific arc suppressors over a predetermined time based on the signal from the coil interface.

In Example 17, the subject matter of Example 16 includes, wherein the predetermined time is selected to allow the contactor coil driver to de-energize and allow time for the power contactor to break or make contact.

In Example 18, the subject matter of any one or more of Examples 15-17 includes, wherein the first phase-specific arc suppressors are configured to not suppress arcing in the negative domain and the second phase-specific arc suppressor is configured to not suppress arcing in the positive domain.

In Example 19, the subject matter of any one or more of Examples 15-18 includes, wherein each of the first and second phase-specific arc suppressors comprise a latching switch configured to cause the first and second phase-specific arc suppressors to not suppress arcing in the negative and positive domains, respectively.

In Example 20, the subject matter of any one or more of Examples 15-19 includes, wherein the latching switch is a thyristor.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

The above detailed description includes references to the accompanying drawings, which form a part of the detailed description. The drawings show, by way of illustration, specific embodiments. These embodiments are also referred to herein as "examples." Such examples may include elements in addition to those shown and described. However, the present inventor also contemplates examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. In addition, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

What is claimed is:

1. An arc suppressing circuit configured to suppress arcing across a power contactor coupled to an alternating current (AC) power source having a predetermined number of phases, each contact of the power contactor corresponding to one of the predetermined number of phases, the arc suppressing circuit comprising:
a number of dual unidirectional arc suppressors equal to the predetermined number of phases of the AC power source, each dual unidirectional arc suppressor coupled across the power contactor, each dual unidirectional arc suppressor comprising:
a first phase-specific arc suppressor configured to suppress arcing across associated contacts of the power contactor in a positive domain;
a second phase-specific arc suppressor configured to suppress arcing across associated contacts of the power contactor in a negative domain; and
a coil lock controller, configured to be coupled between a contact coil driver of the power contactor, configured to detect an output condition from the contact coil driver and inhibit operation of the first and second phase-specific arc suppressors over a predetermined time;
wherein the first phase-specific arc suppressor is configured to not suppress arcing in the negative domain and the second phase-specific arc suppressor is configured to not suppress arcing in the positive domain; and
wherein each of the first and second phase-specific arc suppressors comprise a latching switch configured to cause the first and second phase-specific arc suppressors to not suppress arcing in the negative and positive domains, respectively.

2. The arc suppressing circuit of claim 1, wherein the latching switch is a thyristor.

3. The arc suppressing circuit of claim 2, wherein the coil lock controller comprises:
a power converter coupled over a coil interface;
a rectifier coupled to the power converter;
a power limiter coupled to the rectifier;
a power storage coupled to the power limiter; and
a current supply coupled to the power storage, the current supply coupled to the first phase-specific arc suppressor and the second phase-specific arc suppressor.

4. The arc suppressing circuit of claim 3, wherein the power converter comprises an RC circuit, the rectifier comprises a diode array, the power limiter comprises a Zener diode; the power storage comprises a capacitor; and the current supply comprises a MOSFET transistor.

5. The arc suppressing circuit of claim 3, wherein each of the first and second phase-specific arc suppressors comprise a coil lock, coupled to the coil lock controller, configured to disable a respective one of the first and second phase-specific arc suppressors based on an input from the coil lock controller.

6. The arc suppressing circuit of claim 5, wherein the coil lock comprises a signal isolator emitter coupled to the coil lock controller and a signal isolator detector coupled to the latching switch.

7. The arc suppressing circuit of claim 6, wherein the coil lock is a photorelay comprising the signal isolator emitter and the signal isolator detector.

8. The arc suppressing circuit of claim 6, wherein each of the first and second phase-specific arc suppressors comprises:
   a signal edge detector;
   an edge-pulse converter in series with the signal edge detector;
   a current limiter in series with the edge-pulse converter; and
   a first over voltage protection coupled to the edge-pulse converter and the signal isolator detector of the coil lock.

9. The arc suppressing circuit of claim 8, wherein the edge-pulse converter is at least one of: a transformer; a pulse transformer; or a gate trigger.

10. The arc suppressing circuit of claim 8, wherein each of the dual unidirectional arc suppressors further comprises:
    a first contact terminal configured to be electrically coupled to a first contact of the power contactor;
    a second contact terminal configured to be coupled to be electrically coupled to a second contact of the power contactor, the second contact terminal coupled to the first phase-specific arc suppressor, the second phase-specific arc suppressor, and the coil lock controller; and
    a fusible element coupled between the first contact terminal and the first phase-specific arc suppressor, the second phase-specific arc suppressor, and the coil lock controller.

11. The arc suppressing circuit of claim 10, wherein the fusible element is one of: a solder mask, a silkscreen, a passive fuse, or an active fuse.

12. The arc suppressing circuit of claim 10, wherein each of the dual unidirectional arc suppressors further comprises a second over voltage protector coupled over the first phase-specific arc suppressor, the second phase-specific arc suppressor, and the coil lock controller.

13. The arc suppressing circuit of claim 12, wherein the second over voltage protector comprises at least one of:
    varistor, a transient-voltage suppression (TVS) diode, a Zener diode, a gas tube, or a spark gap.

14. A three-phase arc suppressing circuit, comprising:
    a coil interface, configured to be coupled to a contactor coil driver of a power contactor and to receive an output condition of the contactor coil driver and output a signal based on the output condition;
    a first dual unidirectional arc suppressor configured to be coupled to contacts at a first phase, comprising:
        a first phase-specific arc suppressor configured to suppress arcing in a positive domain;
        a second phase-specific arc suppressor configured to suppress arcing in a negative domain; and
        a coil lock controller, coupled to the coil interface, configured to inhibit operation of the first and second phase-specific arc suppressors over a predetermined time based on the signal from the coil interface;
    a second dual unidirectional arc suppressor configured to be coupled to contacts at a second phase one hundred and twenty degrees greater than the first phase, comprising:
        a first phase-specific arc suppressor configured to suppress arcing in the positive domain;
        a second phase-specific arc suppressor configured to suppress arcing in the negative domain; and
        a coil lock controller, coupled to the coil interface, configured to inhibit operation of the first and second phase-specific arc suppressors over a predetermined time based on the signal from the coil interface; and
    a third dual unidirectional arc suppressor configured to be coupled to contacts at a third phase one hundred and twenty degrees less than the first phase, comprising:
        a first phase-specific arc suppressor configured to suppress arcing in the positive domain;
        a second phase-specific arc suppressor configured to suppress arcing in the negative domain; and
        a coil lock controller, coupled to the coil interface, configured to inhibit operation of the first and second phase-specific arc suppressors over a predetermined time based on the signal from the coil interface.

15. The three-phase arc suppressing circuit of claim 14, wherein the predetermined time is selected to allow the contactor coil driver to de-energize and allow time for the power contactor to break or make contact.

16. The three-phase arc suppressing circuit of claim 15, wherein the first phase-specific arc suppressors are configured to not suppress arcing in the negative domain and the second phase-specific arc suppressor is configured to not suppress arcing in the positive domain.

17. The three-phase arc suppressing circuit of claim 16, wherein each of the first and second phase-specific arc suppressors comprise a latching switch configured to cause the first and second phase-specific arc suppressors to not suppress arcing in the negative and positive domains, respectively.

18. The three-phase arc suppressing circuit of claim 17, wherein the latching switch is a thyristor.

* * * * *